(12) United States Patent
Zhu

(10) Patent No.: US 9,298,859 B2
(45) Date of Patent: Mar. 29, 2016

(54) ELECTRICAL SUBMERSIBLE PUMP DESIGN PARAMETERS RECALIBRATION METHODS, APPARATUS, AND COMPUTER READABLE MEDIUM

(71) Applicant: Baker Hughes Incorporated, Houston, TX (US)

(72) Inventor: DeHao Zhu, Tulsa, OK (US)

(73) Assignee: Baker Hughes Incorporated, Houston, TX (US)

( * ) Notice: Subject to any disclaimer, the term of this patent is extended or adjusted under 35 U.S.C. 154(b) by 570 days.

(21) Appl. No.: 13/764,485

(22) Filed: Feb. 11, 2013

(65) Prior Publication Data

US 2013/0211811 A1   Aug. 15, 2013

Related U.S. Application Data

(60) Provisional application No. 61/598,087, filed on Feb. 13, 2012.

(51) Int. Cl.
*G06F 9/45* (2006.01)
*G06F 17/50* (2006.01)
*G05B 17/02* (2006.01)

(52) U.S. Cl.
CPC ............ *G06F 17/5009* (2013.01); *G05B 17/02* (2013.01); *G05B 2219/24215* (2013.01)

(58) Field of Classification Search
CPC ............ G06F 17/5022; G06F 11/3477; G06F 11/3457; G06F 17/5009; G06F 11/3664
USPC .......................................................... 703/22
See application file for complete search history.

(56) References Cited

U.S. PATENT DOCUMENTS

| 6,947,870 B2 * | 9/2005 | Zhu ........................ G05B 17/02 |
| | | 702/181 |
| 8,196,657 B2 | 6/2012 | Kennedy |

OTHER PUBLICATIONS

B. Gould, "Use of Electrical Submersible Pumping Systems in Offshore and Subsea Environments," Offshore Technology Conference, Houston, TX, May 2-5, 2011.
T. Kohonen, "Self-Organizing Maps," Apr. 27, 2005, found at www.sis.pitt.edu/~ssyn/som/som.html.

* cited by examiner

*Primary Examiner* — Saif Alhija
(74) *Attorney, Agent, or Firm* — Bracewell LLP

(57) ABSTRACT

Apparatus, computer readable medium, program code, and methods for performing a parameter recalibration on parameters for an electrical submersible pump application model, are provided. An example of a method can include generating a data set containing a plurality of winning data sets or rows containing ESP application model input parameters and associated theoretical output parameters for an ESP application model substantially matching a corresponding set of measured ESP output parameters, through application of a self-organizing map analysis on a substantial number of training data sets. An averaging analysis is performed on the plurality of winning data sets or rows to obtain a set of ESP application model input parameters that can be used to recalibrate the ESP application model.

18 Claims, 4 Drawing Sheets

| Row | Out1 | Out2 | Out3 | Out4 | ... | OutN | In1 | In2 | In3 | In4 | In5 | In6 | In7 | In8 | In9 | In10 | ... | InN |
|---|---|---|---|---|---|---|---|---|---|---|---|---|---|---|---|---|---|---|
| 1 | | | | | | | | | | | | | | | | | | |
| 2 | | | | | | | | | | | | | | | | | | |
| 3 | | | | | | | | | | | | | | | | | | |
| 4 | | | | | | | | | | | | | | | | | | |
| 5 | | | | | | | | | | | | | | | | | | |
| 6 | | | | | | | | | | | | | | | | | | |
| ... | | | | | | | | | | | | | | | | | | |
| 1999 | | | | | | | | | | | | | | | | | | |
| 2,000 | | | | | | | | | | | | | | | | | | |

FIG. 3

| Row | Out1 | Out2 | Out3 | Out4 | *** | OutN | In1 | In2 | In3 | In4 | In5 | In6 | In7 | In8 | In9 | In10 | *** | InN |
|---|---|---|---|---|---|---|---|---|---|---|---|---|---|---|---|---|---|---|
| 1 | | | | | | | | | | | | | | | | | | |
| 2 | | | | | | | | | | | | | | | | | | |
| 3 | | | | | | | | | | | | | | | | | | |
| 4 | | | | | | | | | | | | | | | | | | |
| 5 | | | | | | | | | | | | | | | | | | |
| 6 | | | | | | | | | | | | | | | | | | |
| *** | | | | | | | | | | | | | | | | | | |
| 999 | | | | | | | | | | | | | | | | | | |
| 1,000 | | | | | | | | | | | | | | | | | | |

ELECTRICAL SUBMERSIBLE PUMP DESIGN PARAMETERS RECALIBRATION METHODS, APPARATUS, AND COMPUTER READABLE MEDIUM

RELATED APPLICATIONS

This application claims priority to and the benefit of U.S. Provisional Patent Application No. 61/598,087, titled "Electrical Submersible Pump Design Parameters Recalibration Method, Apparatus, and Computer Readable Medium," filed on Feb. 13, 2012, incorporated herein by reference in its entirety.

BACKGROUND OF THE INVENTION

1. Field of the Invention

This invention generally relates to electrical submersible pump modeling, and more particularly, to systems, apparatus, computer program code, and methods related to recalibration of electrical submersible pump design parameters.

2. Description of the Related Art

An accurate Electric Submersible Pump (ESP) application model includes design parameters such as, for example, Productivity Index, Water Cut, and Static Pressure, among others, which are important for ESP performance analysis, failure prevention and production optimization.

Traditional methods involved in maintaining such an accurate model requires data analysts to manually run ESP sizing software and to use the trial-and-error approach in an effort to try to adjust the ESP design parameters until ESP performance data such as intake pressure, discharge pressure, and flow rate from the model can match the measurements from a supervisory control and data acquisition (SCADA) system.

Such process can be tedious and error prone when the engineer must update thousands of ESP application models. Additionally, it is unlikely that the analyst will be able to resolve the data sufficiently to identify the design parameters that provide the closest possible match or near match to that of the SCADA measurements.

Recognized, therefore, by the inventor is the need for a new system, apparatus, computer program, and method that provides for performing a design parameter recalibration on design parameters of an ESP application model that delivers an improved consistent solution.

SUMMARY OF THE INVENTION

In view of the foregoing, various embodiments of the present invention advantageously provide systems, apparatus, computer programs, and methods for performing a design parameter recalibration on design parameters of an electrical submersible pump (ESP) application model through an automated process. Various embodiments of the present invention advantageously provide an improved solution for each of potentially thousands of models requiring design parameter recalibration. Various embodiments of the present invention provide an automated system and computer-assisted methods that deliver an improved solution that is consistent.

An example of a method of analyzing and recalibrating parameters for an electrical submersible pump (ESP) application model includes the steps of retrieving or otherwise receiving a set of input parameters and theoretical output parameters for the ESP application model from a data repository for one of a plurality of ESP application models and retrieving or otherwise receiving a set of measured ESP output parameters related to the theoretical output parameters of the ESP application model. According to the exemplary configuration, the theoretical output parameters are generated by ESP application modeling software, and the measured ESP output parameters are retrieved from a SCADA system.

The steps can also or alternatively include determining differences between the measured ESP output parameters and the theoretical output parameters of the ESP application model generated by the ESP modeling software, and generating the plurality of training data sets when the differences are found to be outside preselected error tolerances. The plurality of training data sets each typically contain a plurality of sets of at least substantially random ESP application model input parameters and corresponding theoretical output parameters. The step of generating the plurality of training data sets can include generating a random set of ESP application model input parameters, applying the randomly generated set of input parameters to the ESP modeling software, and repeating the steps of generating and applying until a preselected number of sets of ESP application model input parameters and corresponding theoretical output parameters forming the respective training data set have been reached, performed for each separate one of the plurality of training data sets.

The steps also include performing a cluster analysis on one of the plurality of training data sets in order to segregate the training data set into a plurality of clusters. Each cluster contains a plurality of data rows from the training data set, and each data row in the same one of the plurality of clusters has at least similar characteristics. The clustering analysis is in the form of a Self-organizing map analysis according to the exemplary configuration. The steps also include mapping the set of measured ESP output parameters to one of the plurality of clusters responsive to a similarity analysis performed on the theoretical output parameter within each cluster to identify a winning cluster, the winning cluster being the one cluster of the at least several data rows collectively having a set of output parameters most closely matching the corresponding set of measured ESP output parameters, and identifying a winning data row within the winning cluster that yields outputs parameters which are the most closest to the corresponding set of measured ESP output parameters to define one of the plurality of winning data rows. The SOM analysis, mapping, and identifying steps are performed repeatedly a predetermined number of times to generate a data set containing a plurality of winning data sets or rows having ESP application model input parameters and associated theoretical output parameters for an ESP application model substantially matching a corresponding set of measured ESP output parameters. An averaging analysis on the plurality of winning data sets or rows is then performed to obtain a final winning row which provides a set of ESP application model input parameters that can be used to recalibrate the ESP application model.

The steps can also or alternatively include feeding the ESP application model input parameters in the final winning row to the ESP modeling software to obtain corresponding theoretical output parameters, and performing a comparison of the theoretical output parameters based upon the ESP model input parameters to the corresponding set of measured ESP output parameters to verify that the theoretical output parameters are within error tolerance. If the theoretical output parameters are outside an error tolerance, and alert can be transmitted to, e.g., engineering indicating that a solution could not be found. If within tolerances, a message can be sent to, e.g., engineering indicating that the model inputs need to be adjusted (recalibrated) with the ESP model input parameters. The above complete set of steps can be performed for as many models as are necessary and for which data has been retrieved/received.

Other embodiments include apparatus, program code, and computer readable medium including program code configured to perform one or more combinations of the above described steps.

BRIEF DESCRIPTION OF THE DRAWINGS

So that the manner in which the features and advantages of the invention, as well as others which will become apparent, may be understood in more detail, a more particular description of the invention briefly summarized above may be had by reference to the embodiments thereof which are illustrated in the appended drawings, which form a part of this specification. It is to be noted, however, that the drawings illustrate only various embodiments of the invention and are therefore not to be considered limiting of the invention's scope as it may include other effective embodiments as well.

FIG. 3 is a table illustration of a portion of a table of a plurality of rows forming a training data set according to an embodiment of the present invention;

FIG. 4 is a table illustration of a portion of a table of a plurality of winning data rows from a winning cluster according to an embodiment of the present invention;

DETAILED DESCRIPTION

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

Various embodiments of the present invention provide systems, apparatus, computer programs, and methods for performing a design parameter recalibration on design parameters of an electrical submersible pump (ESP) application model through an automated process, which provide an improved consistent solution for each of potentially thousands of models requiring design parameter recalibration. Various embodiments of the present invention utilize a Self-Organizing Map (SOM) and averaging function to allow a computerized system to perform the recalibrating automatically without human being intervention, and to provide the accuracy expected through utilization of a Monte Carlo styled simulation.

Figure 1:
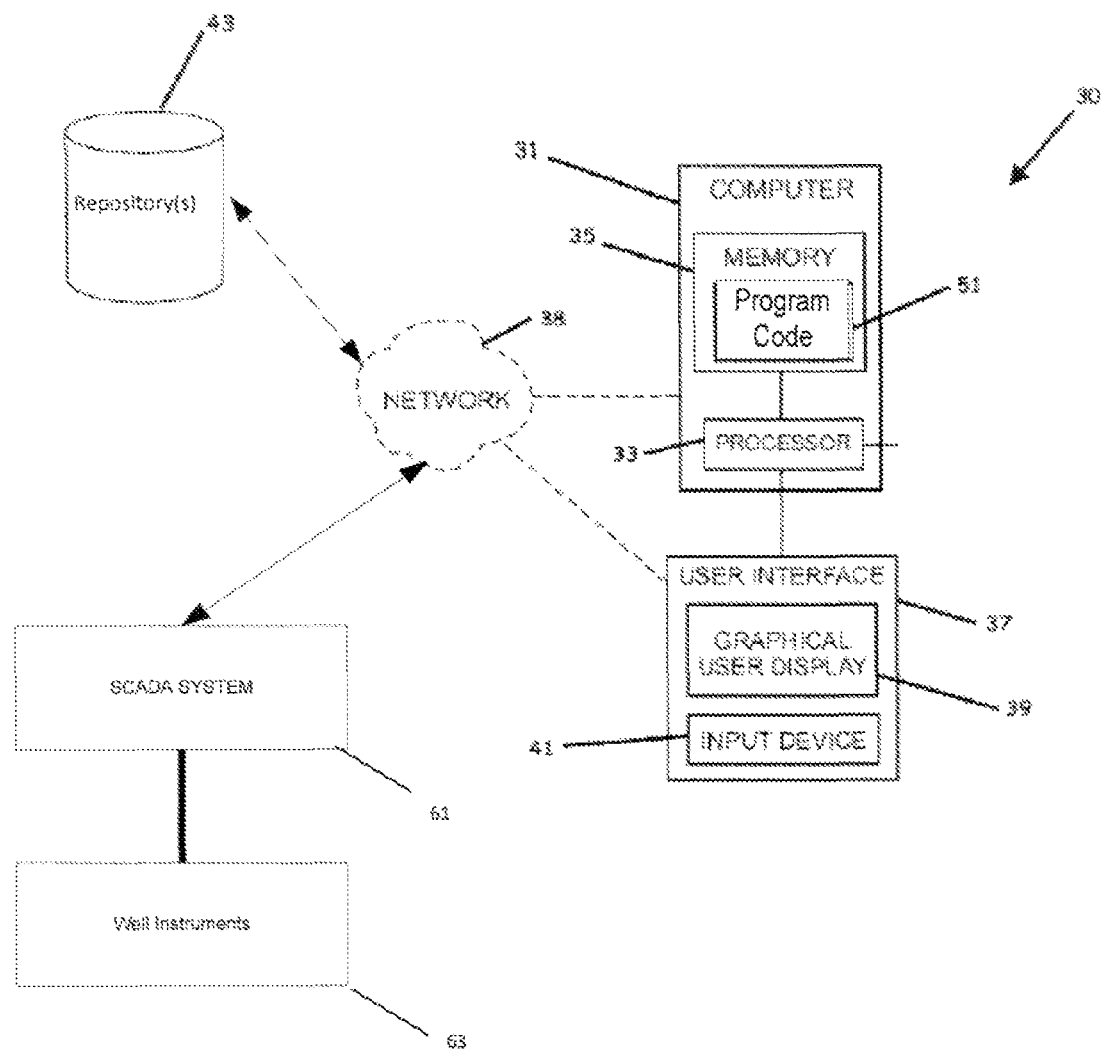
FIG. 1 is a schematic diagram of a general apparatus architecture of an apparatus for managing model design parameters according to an embodiment of the present invention.

FIG. 1 illustrates an apparatus 30 for performing a design parameter recalibration on design parameters of an electrical submersible pump (ESP) application model usable, for example, in performing production-related simulations for multiple wells in a hydrocarbon production field/reservoir. The apparatus 30 can include an ESP model design parameter analyzing computer 31 having a processor 33, memory 35 coupled to the processor 33 to store software or other program code and/or database records therein, and a user interface 37 that can include a graphical display 39 for displaying graphical images, and a user input device 41 as known to those skilled in the art, to provide a user access to manipulate the software and database records. The user interface 37 can be either directly connected to the computer 31 or through a network 38 as known to those skilled in the art.

Note, the computer can be, for example, in the form of a machine including a processor (single core or multi-core) or multiple processors capable of executing instructions to perform the featured steps/operations, and can be embodied as a personal computer, a server, or a server farm serving multiple user interfaces 37 or other configurations known to those skilled in the art. Further, the processor 33 represents, for example, a single processor, a single processor with multiple cores, multiple separately housed processors located within the same computer, and/or one or more of such processors distributed across multiple physically separate computers along with others known to those skilled in the art. The memory 37 can include volatile and nonvolatile memory known to those skilled in the art including, for example, RAM, ROM, and magnetic or optical disks, just to name a few.

The apparatus 30 can also include one or more ESP application model/ESP parameter data repositories as would be understood by those skilled in the art, accessible by the processor 33, collectively referred to as repository 43. The repository 43 can include well log data along with determined well characteristics and measured operational ESP input and output parameters. The repository 43 can also include a typically very large plurality of ESP application models and associated design parameters, stored either in the same repository as that of the measured ESP operational measurements, or a different one or ones of the repositories.

The apparatus 30 can also include an ESP model design parameter analyzing program/program code 51 stored in memory 35 of the ESP model design parameter computer 31. The ESP model design parameter analyzing program 51 is adapted or otherwise configured to analyze and recalibrate ESP model design parameters, according to the various steps/operations described below. The ESP model design parameters can include, for example: static pressure, productivity index, water cut, gas oil ratio, gas separator efficiency, water specific gravity, flow modifier, head modifier, and power modifier. Other potential design parameters can include bottom hole temperature, density of gas, fluid surface temperature, tubing pressure, and casing pressure, among others as would be understood by one of ordinary skill in the art. These parameters can be considered input parameters which when applied to the ESP "black box" portion of the model, produce certain output model parameters.

The analysis and recalibration can be provided so that the output model parameters provided by the ESP application model match or at least substantially match that of real-time measured data, e.g., provided by a SCADA system. The output model parameters can include pump intake pressure, pump discharge pressure, flow rate, and motor amps. Other potential output parameters include motor internal temperature, among others. Beneficially, through measurement of output parameters provided by the SCADA system, various embodiments of the invention can provide down hole data describing at least a subset of the downhole conditions most significantly affecting the actual measured output parameters of a deployed ESP corresponding to the ESP model.

Note, the ESP model design parameter analyzing program 51 can be in the form of microcode, programs, routines, and symbolic languages that provide a specific set or sets of ordered operations that control the functioning of the hardware and direct its operation, as known and understood by those skilled in the art. Note also, the ESP model design parameter analyzing program 51, according to one or more of the embodiments of the present invention, need not reside in its entirety in volatile memory, but can be selectively loaded, as necessary, according to various methodologies as known and understood by those skilled in the art.

According to the exemplary embodiment, the apparatus 30 is in communication with a SCADA system 61 which is, in turn, in communication with various well instruments 63 including those located at the surface and downhole. The well instruments 63 can provide measured ESP related parameters including, but not limited to pump intake pressure, pump discharge pressure, pump amperage, output flow rate, and/or others, for example, which can constitute the category of output parameters of the ESP application model. In an ideal scenario, the values of the theoretical output parameters of the ESP application model will match those as measured by the well instruments 63.

Figure 2:
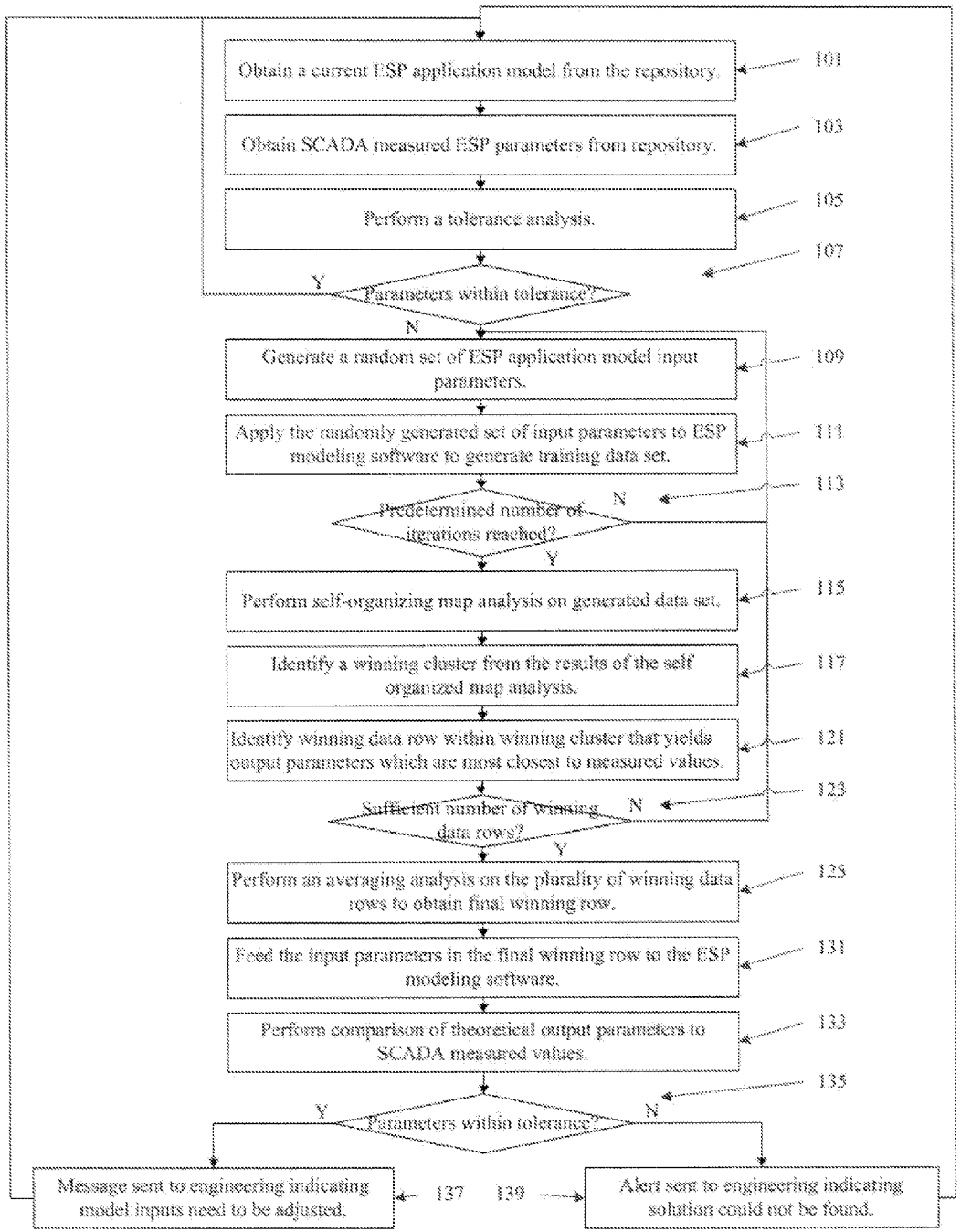
FIG. 2 is a schematic flow diagram illustrating steps for performing a parameter recalibration on design parameters for an electrical submersible pump application model according to an embodiment of the present invention.

FIG. 2 illustrates an exemplary flowchart describing an example of an embodiment of the method steps/operations for performing a design parameter recalibration on design parameters of an electrical submersible pump (ESP) application model usable, for example, in performing production-related simulations for multiple wells in a hydrocarbon production field/reservoir.

According to the illustrated embodiment, for each of a plurality of ESP application models, the steps/operations can include obtaining the current ESP application model from repository 43 (block 101). The model is typically stored in the form of a design or sizing file for the ESP system. The steps/operations can also include obtaining measured ESP related parameters from the repository 43 including, but not limited to pump intake pressure, pump discharge pressure, pump amperage, and output flow rate, for example, which reflect the categories of output parameters of the ESP application model (block 103). Alternatively, the measured ESP related parameters can be obtained directly from the SCADA system 61, which can provide real-time measurements provided, for example, by the well instruments 63.

The steps/operations can also include comparing the SCADA values with the data in current ESP application model to determine if the measured values are within the tolerances of the output parameters of the ESP application model, or vice versa (block 105). For example, the process can compare the measured and design specified intake pressures.

If the model output parameters are found to be within tolerances (block 107), the process ends for this particular ESP application model. The next ESP application model in the queue can be retrieved for analysis.

If the output parameters no longer match, within tolerances, the embodiments of the present invention can adjust the design parameters (ESP application model input parameters), such as, for example, the water cut, productivity index, and static pressure, and/or others, in order to match the model output values with the measured values. In other words, by changing the ESP application model input parameters, the new theoretical output parameters should match, or at least approximately match, i.e., within tolerances, with that acquired from the field.

Accordingly, if the model output parameters are found to be out of tolerances, the steps/operations can include generating a random set of ESP application model input parameters, such as, for example, water cut, static pressure, etc. (block 109) and applying the randomly generated set of input parameters to the ESP modeling software (block 111). Each set of input parameters will yield a set of theoretical output parameters, such as, for example, a theoretical intake pressure, discharge pressure, etc. According to the exemplary configuration, the input and output parameters together can be used as one data row in a training/preliminary data set, whereby each data row represents a "possible" valid operating condition for an ESP operation.

The steps/operations can also include repeating the steps/operations of generating a random set of input parameters and applying the input parameters to the ESP modeling software (e.g., 1000-10000 times) until a preselected number of input-output parameter sets forming a data row have been reached (block 113) in order to obtain a training data set. A data set is made of multiple data rows. A data row comprises of a row of data that has all input parameters and output parameters listed. FIG. 3 illustrates a training data set generated according to the steps described above.

The steps/operations can also include performing a Self-organizing map analysis, or other form of cluster analysis providing similar functionality, on the generated training data set in order to segregate the training data set into at least several clusters (block 115). Each cluster will typically contain several data rows from the training data set based on similarity. Data rows in the same cluster will generally have the same, or at least similar, characteristics in terms of ESP performance and well condition.

The steps/operations can also include mapping the SCADA measured data set to one of those clusters responsive to a similarity analysis performed on the model output parameters to identify a winning cluster (block 117). The model output parameters can include, for example, the pump intake pressure, pump discharge pressure, and/or pump flow rate, to thereby define a winning cluster. The winning cluster is the one cluster of at least several data rows collectively having output parameters characteristics most closely matching those of the SCADA measured data.

The steps/operations also include identifying the data row within the winning cluster that yields outputs parameters which are the most closest to the SCADA measured values (block 121). We denote this data row as winning data row.

The steps/operations can also include repeating the steps of (block 109)-(block 121) to generate a plurality of winning data rows (block 123) and performing an averaging analysis on the plurality of winning data rows to obtain final winning row (block 125).

FIG. 4 illustrates an example of a data set containing winning data rows. The first six columns represent examples of the theoretical output parameters of the ESP application model. In this example, the output parameters include pump intake pressure, pump amperage, pump discharge pressure, and output flow rate. The remaining columns represent examples of "input" parameters of the ESP application model to include static pressure (Pr), productivity index (PI), gas oil ratio (GOR), water cut (WaterCut), water specific gravity (SGWater), gas separator efficiency (GSEff), flow modifier (VCF), head modifier (VCH), power modifier (VCP), controller frequency (Freq), tubing pressure (Ptbg), and surface temperature (Tsurf). Note, the four output parameters and 12 input parameters listed above are by way of example. Less or more output parameters and less or more input parameters as would be understood by one of ordinary skill in the art are within the scope of the present invention. Additionally, other variables such as, for example, Namps, WideOpenFlow, and/or Namps can be embedded within the data rows for usage by other programs.

The steps/operations can also include feeding the input parameters in the final winning row to the ESP modeling software to obtain the theoretical output parameters, such as intake pressure, discharge pressure, etc. (block 131), and performing a comparison of the ESP application model theoretical output parameters based upon the recalibrated input parameters to the SCADA measured values (block 133) to verify that the theoretical output parameters are within the error tolerance (block 135). If within tolerances, the recalibration analysis for this ESP application model terminates, a message is sent to engineering to indicate that the inputs need to be adjusted for the ESP application model (block 137), and a new ESP application model can be obtained. If not, and alert can be provided to engineering to indicate that the ESP application model failed to yield output parameters within error tolerances (block 139).

In a non-limiting illustration, assume that an engineer or technician is trying to match measured data received from field instruments, e.g., SCADA Pip=1160, SCADA Pdp=3500, SCADA Flow=850, SCADA Amps=35.3, and that the measured values are not within the tolerances of the output parameters of the ESP application model. In order to develop a training data set or set file, a large number of random values and random combinations of values for the input-type parameters (e.g., typically greater than 1000) are generated and applied to the ESP design algorithm portion of the ESP model to produce a corresponding output parameters. The output and input parameters can be assigned to a table (see, e.g., FIG. 3) whereby each row represents different theoretical output parameters from based on a corresponding set of randomly generated input parameters.

In such a scenario, for an exemplary sample having 2000 rows, one can expect to have samples that have theoretical output parameter values that vary greatly from the measured output values. Some of the rows, however, can be expected to show results similar to the measured data. These rows are possible winning rows.

To obtain all possible winner rows, a cluster analysis, such as a self-organizing map (SOM) analysis, can be employed. The four attributes for this SOM analysis will be Pip, Pdp, Flow and Amps. The SOM will separate all 2000 data samples into groups, e.g., 25 groups in this scenario, based on similarity among Pip-Pdp-Flow-Amps, with one of the group having will have all of the possible winners.

A second file shows all of the possible winners identified by SOM as a result of an analysis of 1000 training data sets each having 2000 training data rows. This data set can be considered a composite winning cluster since it has multiple winning rows, each at least closely matching the desired values: Pip=1160, Pdp=3500, Flow=850, Amps=35.3. From this composite cluster of winning data rows, one can calculate the average of each input value associated with each respective role. For example, the 1000 winning data rows provide 1000 different values for WaterCut and GOR. From this, the average WaterCut and the average GOR across their respective 1000 values can be calculated to obtain a final winning row. The input parameters values in this final winning row are the values that can be used to recalibrate the ESP application model.

It is important to note that while embodiments of the present invention have been described in the context of a fully functional system/apparatus, those skilled in the art will appreciate that the mechanism of at least portions of the present invention and/or aspects thereof are capable of being distributed in the form of a non-transitory computer readable medium storing/containing or otherwise embodying instructions in a variety of forms for execution on one or more processors, or the like, and that embodiments of the present invention apply equally regardless of the particular type of media used to actually carry out the distribution. Non-transitory computer readable medium or media which is understood to mean includes all forms of computer readable storage media that do not fall under the category of being non-statutory subject matter, in general, or take the form of a propagating signal per se, in particular. Examples of the non-transitory computer readable media include but are not limited to: nonvolatile, hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, HD-DVDs, memory sticks, mini disks, laser disks, Blu-ray disks, flash drives, and other newer types of memories, and in certain circumstances, transmission type media such as digital and analog communication links capable of storing/containing or otherwise embodying the instructions. For example, such media can store or otherwise contain both operating instructions and operations instructions related to the program/program code 51 and the method steps, described above.

Various embodiments the present invention provides several advantages. For example, various embodiments advantageously can utilize a Self-Organizing Map (SOM) and averaging function to allow a computerized system to perform the recalibrating automatically without human being intervention, and to provide the accuracy expected through utilization of a Monte Carlo styled simulation. Various embodiments of the present invention advantageously provide a new apparatus, software, and methods that can be used to perform ESP application model tune-up for multiple ESP/wells from an oil field. Various embodiments of the present invention also advantageously provide a browser-based graphical user interface and an enhanced interface with a SCADA measurements repository.

This application claims priority to and the benefit of U.S. Provisional Patent Application No. 61/598,087, titled "Electrical Submersible Pump Design Parameters Recalibration Method, Apparatus, and Computer Readable Medium," filed on Feb. 13, 2012, incorporated herein by reference in its entirety.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification.

The invention claimed is:

1. A method of analyzing and recalibrating parameters for an electrical submersible pump (ESP) application model, the method comprising the steps of:

generating, by a processor, a data set comprising a plurality of sets of ESP application model input parameters and associated theoretical output parameters for an ESP application model substantially matching a corresponding set of measured ESP output parameters defining a plurality of winning data sets or rows; and performing an averaging analysis, by the processor, on the plurality of winning data sets or rows to obtain a set of ESP application model input parameters usable to recalibrate the ESP application model, wherein the step of generating a data set comprises performing the following steps for each of a plurality of training data sets:

performing a cluster analysis, by the processor, on one of the plurality of training data sets in order to segregate the training data set into a plurality of clusters, each cluster containing a plurality of data rows from the training data set, each data row in the same one of the plurality of clusters having at least similar characteristics;

mapping, by the processor, the set of measured ESP output parameters to one of the plurality of clusters responsive to a similarity analysis performed on the theoretical output parameter within each cluster to identify a winning cluster, the winning cluster being the one cluster of at least several data rows collectively having a set of output parameters most closely matching the corresponding set of measured ESP output parameters; and identifying, by the processor, a winning data row within the winning cluster that yields outputs parameters which are the most closest to the corresponding set of measured ESP output parameters to define one of the plurality of winning data rows.

2. A method as defined in claim 1, wherein the cluster analysis comprises a Self-organizing map analysis.

3. A method as defined in claim 2, wherein each of the plurality of training data sets comprise a plurality of sets of at least substantially random ESP application model input parameters and corresponding theoretical output parameters.

4. A method as defined in claim 3, further comprising the steps of:

retrieving, by the processor, a set of input parameters and theoretical output parameters for the ESP application model from a data repository for one of a plurality of ESP application models, the theoretical output parameters generated by ESP application modeling software;

retrieving, by the processor, the set of measured ESP output parameters related to the theoretical output parameters of the ESP application model, the measured ESP output parameters retrieved from a SCADA system;

determining, by the processor, differences between the measured ESP output parameters and the theoretical output parameters of the ESP application model generated by the ESP modeling software; and generating, by the processor, the plurality of training data sets when the differences are found to be outside preselected error tolerances.

5. A method as defined in claim 4, wherein the step of generating the plurality of training data sets comprises performing the following steps for each separate one of the plurality of training data sets:

generating, by the processor, a random set of ESP application model input parameters;

applying, by the processor, the randomly generated set of input parameters to the ESP modeling software; and repeating, by the processor, the steps of generating and applying until a preselected number of sets of ESP application model input parameters and corresponding theoretical output parameters forming the respective training data set have been reached.

6. A method as defined in claim 5, wherein the step of performing an averaging analysis on the plurality of winning data sets or rows results in a final winning data set or row, the method further comprising the step of performing a quality control analysis comprising the steps of:

feeding, by the processor, the ESP application model input parameters in the final winning row defining recalibrated ESP model input parameters to the ESP modeling software to obtain corresponding theoretical output parameters;

performing, by the processor, a comparison of the theoretical output parameters based upon the recalibrated ESP model input parameters to the corresponding set of measured ESP output parameters to verify that the theoretical output parameters are within error tolerance; and providing, by the processor, an alert when the theoretical output parameters are outside the error tolerance.

7. A method of analyzing and recalibrating parameters for an electrical submersible pump (ESP) application model, the method comprising the steps of:

performing, by a processor, the following for each of a plurality of training data sets to generate a data set comprising a plurality of sets of ESP application model input parameters and associated theoretical output parameters for an ESP application model substantially matching a corresponding set of measured ESP output parameters defining a plurality of winning data sets or rows, each of the plurality of training data sets comprising a plurality of sets of ESP application model input parameters and corresponding theoretical output parameters:

performing, by the processor, a cluster analysis on one of the plurality of training data sets in order to segregate the training data set into a plurality of clusters, each cluster containing a plurality of data subsets or rows from the training data set, each data subset or row in the same one of the plurality of clusters having at least similar characteristics, mapping the set of measured ESP output parameters to one of the plurality of clusters responsive to a similarity analysis performed on the theoretical output parameters within each cluster to identify a winning cluster, the winning cluster being the one cluster of the plurality of clusters collectively having a set of theoretical output parameters most closely matching the corresponding set of measured ESP output parameters, and identifying a data set or row within the winning cluster that yields outputs parameters which are the most closest to the corresponding set of measured ESP output parameters to define one of the plurality of winning data sets or rows; and performing, by the processor, an averaging analysis on the plurality of winning data sets or rows to obtain a set of ESP application model input parameters usable to recalibrate the ESP application model, wherein the cluster analysis comprises a Self-organizing map analysis.

8. A method as defined in claim 7, wherein the a plurality of sets of ESP application model input parameters and corresponding theoretical output parameters in each of the plurality of training data sets comprise a plurality of sets of at least substantially random ESP application model input parameters and corresponding theoretical output parameters.

9. Non-transitory computer readable medium having processor readable electrical submersible pump model design analyzing program code embodied on the computer readable medium, the processor readable program code for programming one or more processors to perform operations for analyzing and recalibrating parameters for an electrical submersible pump (ESP) application model, the processor readable program code comprising a set of instructions that when executed by the one or more processors, cause the one or more processors to perform the operations of:

generating a data set comprising a plurality of sets of ESP application model input parameters and associated theoretical output parameters for an ESP application model substantially matching a corresponding set of measured ESP output parameters defining a plurality of winning data sets or rows; and performing an averaging analysis on the plurality of winning data sets or rows to obtain a set of ESP application model input parameters usable to recalibrate the ESP application model, wherein the operation of generating a data set comprises performing the following operations for each of a plurality of training data sets:

performing a cluster analysis on one of the plurality of training data sets in order to segregate the training data set into a plurality of clusters, each cluster containing a plurality of data rows from the training data set, each data row in the same one of the plurality of clusters having at least similar characteristics;

mapping the set of measured ESP output parameters to one of the plurality of clusters responsive to a similarity analysis performed on the theoretical output parameter within each cluster to identify a winning cluster, the winning cluster being the one cluster of at least several data rows collectively having a set of output parameters most closely matching the corresponding set of measured ESP output parameters; and identifying a winning data row within the winning cluster that yields outputs parameters which are the most closest to the corresponding set of measured ESP output parameters to define one of the plurality of winning data rows.

10. A non-transitory computer readable medium as defined in claim 9, wherein the cluster analysis comprises a Self-organizing map analysis.

11. A non-transitory computer readable medium as defined in claim 10, wherein each of the plurality of training data sets comprise a plurality of sets of at least substantially random ESP application model input parameters and corresponding theoretical output parameters.

12. A non-transitory computer readable medium as defined in claim 11, wherein the operations further comprise:

receiving a set of input parameters and theoretical output parameters for the ESP application model from a data repository for one of a plurality of ESP application models, the theoretical output parameters generated by ESP application modeling software;

receiving the set of measured ESP output parameters related to the theoretical output parameters of the ESP application model, the measured ESP output parameters retrieved from a SCADA system;

determining differences between the measured ESP output parameters and the theoretical output parameters of the ESP application model generated by the ESP modeling software; and generating the plurality of training data sets when the differences are found to be outside preselected error tolerances.

13. A non-transitory computer readable medium as defined in claim 12, wherein the operation of generating the plurality of training data sets comprises performing the following operations for each separate one of the plurality of training data sets:

generating a random set of ESP application model input parameters;

applying the randomly generated set of input parameters to the ESP modeling software; and repeating the steps of generating and applying until a preselected number of sets of ESP application model input parameters and corresponding theoretical output parameters forming the respective training data set have been reached.

14. An apparatus for analyzing and recalibrating parameters for an electrical submersible pump (ESP) application model, the apparatus comprising:

a ESP model design parameter analyzing computer including a processor and memory coupled to the processor; and an ESP model design parameter analyzing program configured to analyze and recalibrate parameters for an ESP model, the program stored in the memory of the ESP model design parameter analyzing computer and including instructions that when executed by the ESP model design parameter analyzing computer, cause the computer to perform the operations of:

generating a data set comprising a plurality of sets of ESP application model input parameters and associated theoretical output parameters for an ESP application model substantially matching a corresponding set of measured ESP output parameters defining a plurality of winning data sets or rows, and performing an averaging analysis on the plurality of winning data sets or rows to obtain a set of ESP application model input parameters usable to recalibrate the ESP application model, wherein the operation of generating a data set comprises performing the following operations for each of a plurality of training data sets:

performing a cluster analysis on one of the plurality of training data sets in order to segregate the training data set into a plurality of clusters, each cluster containing a plurality of data rows from the training data set, each data row in the same one of the plurality of clusters having at least similar characteristics;

mapping the set of measured ESP output parameters to one of the plurality of clusters responsive to a similarity analysis performed on the theoretical output parameter within each cluster to identify a winning cluster, the winning cluster being the one cluster of at least several data rows collectively having a set of output parameters most closely matching the corresponding set of measured ESP output parameters; and identifying a winning data row within the winning cluster that yields outputs parameters which are the most closest to the corresponding set of measured ESP output parameters to define one of the plurality of winning data rows.

15. An apparatus as defined in claim 14, wherein the cluster analysis comprises a Self-organizing map analysis.

16. An apparatus as defined in claim 15, wherein each of the plurality of training data sets comprise a plurality of sets of at least substantially random ESP application model input parameters and corresponding theoretical output parameters.

17. An apparatus as defined in claim 16, wherein the operations further comprise:

receiving a set of input parameters and theoretical output parameters for the ESP application model from a data repository for one of a plurality of ESP application models, the theoretical output parameters generated by ESP application modeling software;

receiving the set of measured ESP output parameters related to the theoretical output parameters of the ESP application model, the measured ESP output parameters retrieved from a SCADA system;

determining differences between the measured ESP output parameters and the theoretical output parameters of the ESP application model generated by the ESP modeling software; and generating the plurality of training data sets when the differences are found to be outside preselected error tolerances.

18. An apparatus as defined in claim 17, wherein the operation of generating the plurality of training data sets comprises performing the following operations for each separate one of the plurality of training data sets:

generating a random set of ESP application model input parameters;

applying the randomly generated set of input parameters to the ESP modeling software; and repeating the steps of generating and applying until a preselected number of sets of ESP application model input parameters and corresponding theoretical output parameters forming the respective training data set have been reached.

* * * * *